US011652495B2

(12) United States Patent
Bongner et al.

(10) Patent No.: US 11,652,495 B2
(45) Date of Patent: May 16, 2023

(54) PATTERN-BASED STRING COMPRESSION

(71) Applicant: MASTERCARD INTERNATIONAL INCORPORATED, Purchase, NY (US)

(72) Inventors: Stephen Bongner, Dardenne Prairie, MO (US); Arthur Tateishi, Toronto (CA); Adel Amodwala, Pickering (CA)

(73) Assignee: MASTERCARD INTERNATIONAL INCORPORATED, Purchase, NY (US)

( * ) Notice: Subject to any disclaimer, the term of this patent is extended or adjusted under 35 U.S.C. 154(b) by 65 days.

(21) Appl. No.: 17/475,183

(22) Filed: Sep. 14, 2021

(65) Prior Publication Data

US 2023/0101865 A1 Mar. 30, 2023

(51) Int. Cl.
*H03M 7/30* (2006.01)
*G06F 7/14* (2006.01)

(52) U.S. Cl.
CPC ............ *H03M 7/3084* (2013.01); *G06F 7/14* (2013.01)

(58) Field of Classification Search
CPC .... H03M 7/3086; H03M 7/30; H03M 7/3084; H03M 7/3088; H03M 7/3091; H03M 7/4031; H03M 7/4037; H03M 7/4043; H03M 7/4056; H03M 7/6011; H03M 7/6017; G06F 12/00; G06F 16/17; G06F 16/221; G06F 16/3341; G06F 16/90344; G06F 16/951; G06F 3/0608; G06F 3/0661; G06F 3/0673
USPC ..................................... 341/51, 87, 106, 107
See application file for complete search history.

(56) References Cited

U.S. PATENT DOCUMENTS

| | | | | | |
|---|---|---|---|---|---|
| 5,525,982 | A | * | 6/1996 | Cheng | ................. H03M 7/3086 341/51 |
| 6,041,323 | A | * | 3/2000 | Kubota | ............... G06F 16/3341 707/999.005 |
| 6,320,522 | B1 | * | 11/2001 | Satoh | ...................... H03M 7/40 341/51 |
| 7,447,263 | B2 | * | 11/2008 | Yang | ....................... H03M 7/30 375/240 |
| 9,378,126 | B2 | * | 6/2016 | Kataoka | .................. G06F 12/00 |
| 9,985,648 | B1 | * | 5/2018 | Wu | ...................... H03M 7/3086 |
| 2009/0015441 | A1 | * | 1/2009 | Monro | ..................... H03M 7/46 341/51 |

(Continued)

*Primary Examiner* — Linh V Nguyen
(74) *Attorney, Agent, or Firm* — Pillsbury Winthrop Shaw Pittman LLP

(57) ABSTRACT

The disclosure relates to compressing strings by reducing the number of string characters that are stored. For example, a system may generate a first radix tree for a set of strings and a second radix tree for a reverse of each of the set of strings. The system may merge nodes of the first radix tree and/or second radix tree based on a tuning parameter. The system may identify, based on the first radix tree, beginning portions of at least two strings that match and identify, based on the second radix tree, ending portions of at least two strings that match. The system may use the matching beginning portions, the unique portions, and/or the matching ending portions to generate a pattern that matches the two or more strings. The system may store the two or more strings in association with the generated pattern without their matching beginning and/or ending portions.

20 Claims, 9 Drawing Sheets

(56) References Cited

U.S. PATENT DOCUMENTS

| | | | |
|---|---|---|---|
| 2009/0016453 A1* | 1/2009 | Monro | H03M 7/30 |
| | | | 375/241 |
| 2014/0289208 A1* | 9/2014 | Itani | H03M 7/3086 |
| | | | 707/693 |
| 2016/0028415 A1* | 1/2016 | Kataoka | H03M 7/4037 |
| | | | 341/65 |
| 2016/0173127 A1* | 6/2016 | Itani | H03M 7/6011 |
| | | | 341/67 |
| 2016/0226511 A1* | 8/2016 | Kataoka | H03M 7/3084 |
| 2016/0226516 A1* | 8/2016 | Kataoka | H03M 7/405 |

\* cited by examiner

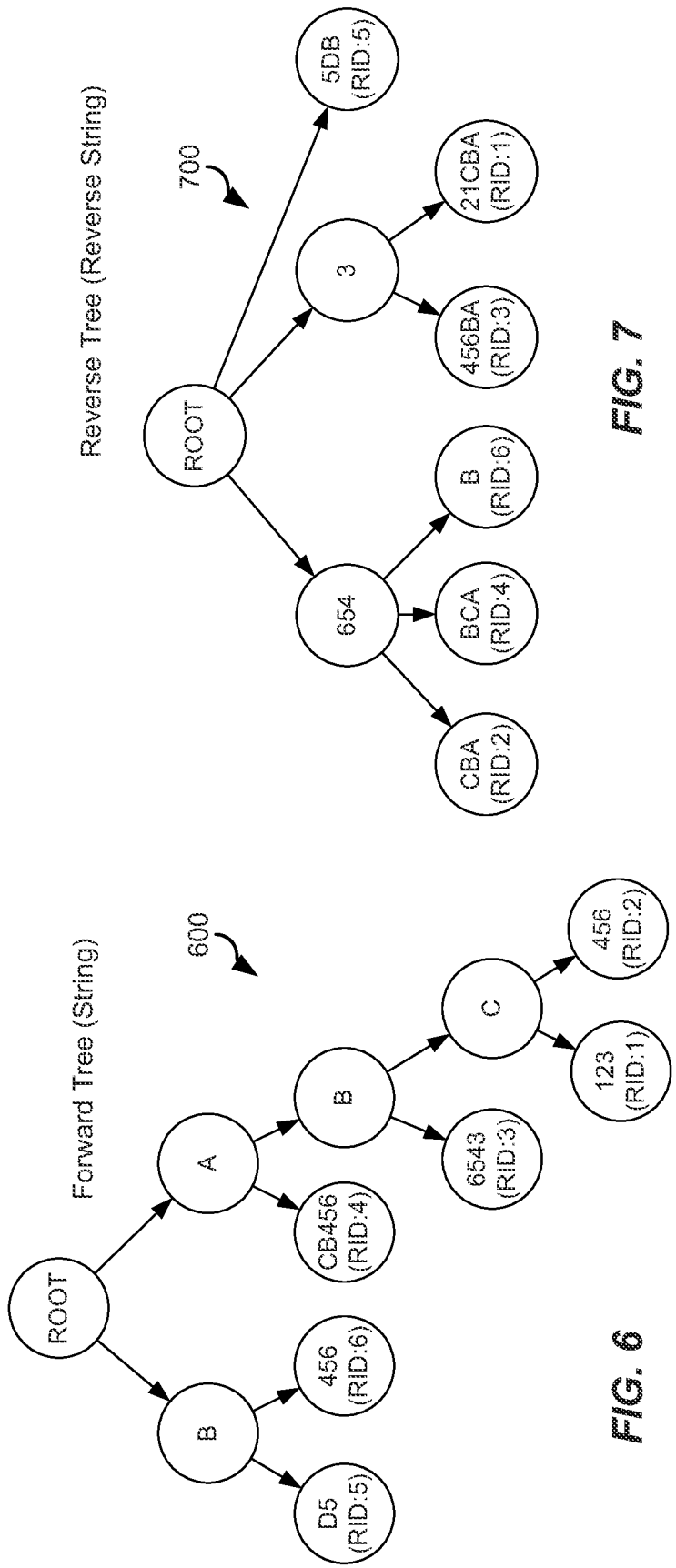

US 11,652,495 B2

PATTERN-BASED STRING COMPRESSION

BACKGROUND

Data-driven applications are a major and still-growing part of technology solutions, including financial technology solutions. As the name implies, data is the driving force behind these applications, and the more data an individual application has access to, the more power there is to drive that force. As a result, the amount of data being produced continues to grow at a rapid pace. Although advanced data storage systems, including cloud storage services and onsite storage systems, have been developed, storing massive quantities of data can be problematic because of the storage and other computational power required for such storage. Furthermore, data is oftentimes a persistent high cost especially when stored on cloud-based systems with redundancy and even when stored onsite. While compression techniques have been developed to compress data, these techniques may not be suitable for high-speed read and write operations. Thus, what is needed is efficient data compression to reduce data storage while having minimal impact on read or write speeds.

BRIEF DESCRIPTION OF THE DRAWINGS

Features of the present disclosure may be illustrated by way of example and not limited in the following figure(s), in which like numerals indicate like elements, in which:

FIG. 5 illustrates an example of strings each identified by a record identifier and a reverse string that is generated for each string to facilitate pattern generation;

FIG. 6 illustrates an example of a first data structure that represents the strings illustrated in FIG. 5;

FIG. 7 illustrates an example of a second data structure that represents the reverse strings illustrated in FIG. 5;

DETAILED DESCRIPTION

Figure 1:
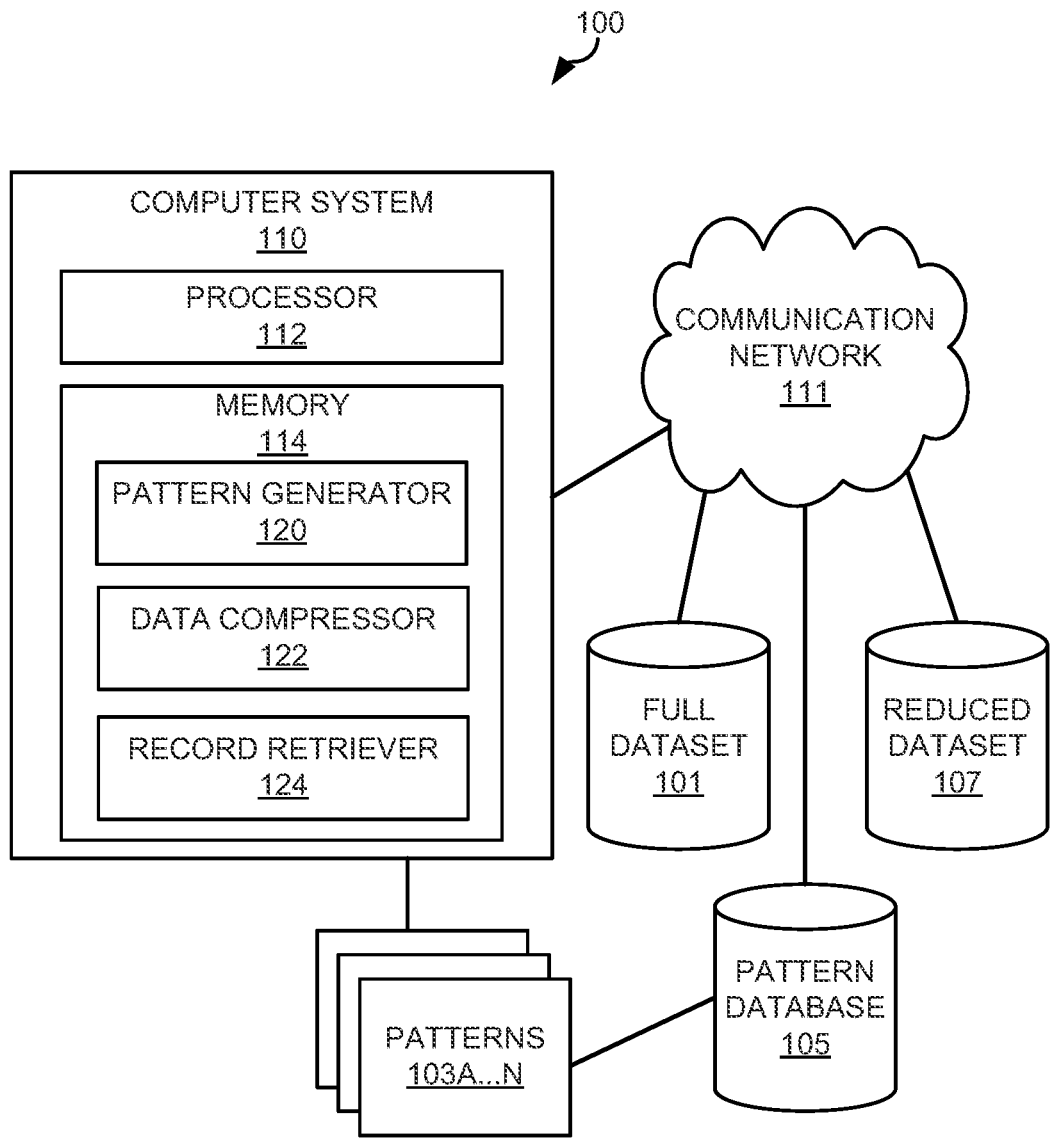
FIG. 1 illustrates an example of a system environment that includes a computer system to generate patterns in strings to compress data.

The disclosure herein relates to systems and methods of compressing data records having strings to reduce storage requirements of the data records based on patterns. A pattern may refer to an expression that matches two or more strings without including all the literal characters of the two or more strings. In some examples, a pattern may include or be expressed as a regular expression. Records with strings may be compressed using pattern matching to omit portions of strings that match a pattern and storing only unique portions of the strings. Because pattern matching is an efficient operation, read and/or write speeds may be maintained while reducing the size of strings to be stored based on the patterns.

A pattern may include a head pattern portion, an expression portion, and/or a tail pattern portion. The head pattern portion may be based on a common prefix portion that is common to two or more strings. An example of a common prefix portion is a substring that matches two or more strings at their beginning. The expression portion may be based on respective unique portions of the two or more strings. The tail pattern portion may be based on a common suffix portion that is common to two or more strings. An example of a common suffix portion is a substring that matches two or more strings at their ends. Thus, two or more strings that have the same beginning and/or the same ends but have unique inner portions relative to one another may be expressed as a pattern. As such, each of these strings may be stored only with their respective unique portions and an association with the pattern, thereby reducing storage requirement for the strings.

To generate patterns, a system may analyze the strings to identify the head pattern portion, the expression portion, and/or the tail pattern portion. In one example, the system may generate a first data structure that represents a set of strings from which a pattern is to be generated. The first data structure may be hierarchically organized into parent nodes and leaf nodes. The parent nodes may each be associated with a respective common prefix portion and the leaf nodes may each be associated with a unique portion of a respective string. As such, the system may use the generated first data structure to generate head pattern portions on the parent nodes and/or the leaf nodes. One example of a first data structure may include a radix tree. A radix tree is a circuit of nodes that, in a textual domain, stores common prefixes among strings in parent nodes, and the unique tails of each string in its leaves. Thus, a first radix tree generated based on a set of strings may include parent nodes that are associated with common prefix portions of the strings and leaf nodes that are associated with unique remaining portions. Each leaf node may be associated with a record identifier, which may uniquely identify a corresponding string. An example of a radix tree is described in U.S. Pat. No. 5,873,078, which is incorporated by reference in its entirety herein for all purposes.

In some examples, to generate tail pattern portions, the system may generate a second data structure that represents a reverse of each of the strings in the set of strings. The second data structure may be hierarchically organized in a manner similar to the first data structure. Because the strings are reversed for the second data structure, the system may generate tail pattern portions of strings based on parent nodes and/or leaf nodes of the generated second data structure. Similar to the first data structure, an example of the second data structure may include a radix tree and each leaf node may be associated with a record identifier. Thus, for a given record identifier and its corresponding string, there may exist a leaf node in the first radix tree and a leaf node in the second radix tree.

In some examples, the system may apply merging to the first data structure and/or the second data structure. Merging may reduce the size of the first data structure and/or the second data structure. For example, the system may roll parent nodes into a child node in the hierarchy based on a merge parameter that defines a size threshold at which to conduct merging. In this manner, nodes that are too small according to the merge parameter may be merged into a child node, reducing the number of parent nodes and therefore overall size of the first data structure and/or second data structure to which merging is applied, if at all. The merge parameter may be adjusted as necessary to achieve a desired size of the first data structure and/or second data structure.

Once the patterns are generated, the system may select one or more of the generated patterns based on the number of strings in the data to be compressed that match each pattern. In this way, the system may select patterns that will match a threshold number of strings to be compressed. The threshold number of strings may be adjusted to achieve a desired number of patterns and/or number of strings covered by the patterns. The system may use the selected patterns to compress an existing database of strings and/or may compress new data records with strings that match a selected pattern. Thus, existing and/or new data may be compressed based on the generated patterns, reducing the storage requirements of data that include strings. Having described an overview of various system operations, attention will now turn to a more detailed description of a system to generate patterns to compress data.

For example, FIG. 1 illustrates an example of a system environment 100 that includes a computer system 110 that generates patterns in strings to compress data. A string may refer to a sequence of one or more characters as generally understood in computer technology. A character may be a unit of information such as a letter, a number, a symbol, and/or other data that may be included in a string as generally understood in computer technology. Generally speaking, the systems and methods may identify one or more patterns in strings and use the patterns to omit the storage of at least a portion (such as one or more characters) of strings, thereby reducing the size of strings that are stored. "Compress" as used herein may refer to reducing a number of characters in a string that is stored, thereby reducing the space on a storage medium required to store the string. Thus, the term "decompress" as used herein may refer to restoring the original string by restoring the removed characters.

The system environment 100 may further include a full dataset 101, a pattern database 105, a reduced dataset 107, and/or other components. The full dataset 101 may include uncompressed data having strings to be compressed. The pattern database 105 may store patterns 103 (illustrated as patterns 103A . . . N) generated and used by the computer system 110 to compress strings. In some examples, the full dataset 101 may be replaced by the reduced dataset 107, which includes a compressed version of at least some of the strings in the full dataset 101. In some examples, the full dataset 101 may be retained while new data is compressed and stored with the full dataset 101. In either instance, storage requirements may be reduced based on the generation and use of patterns 103 described herein.

The computer system 110 may be programmed to generate patterns based on an analysis of a set of strings and compress data based on the patterns. To do so, the computer system 110 may include a processor 112, a memory 114, a pattern generator 120, a data compressor 122, a record retriever 124, and/or other components. The processor 112 may be a semiconductor-based microprocessor, a central processing unit (CPU), an application specific integrated circuit (ASIC), a field-programmable gate array (FPGA), and/or other suitable hardware device. Although the computer system 110 has been depicted as including a single processor 112, it should be understood that the computer system 110 may include multiple processors, multiple cores, or the like. The memory 114 may be an electronic, magnetic, optical, or other physical storage device that includes or stores executable instructions. The memory 114 may be, for example, Random Access memory (RAM), an Electrically Erasable Programmable Read-Only Memory (EEPROM), a storage device, an optical disc, and the like. The memory 114 may be a non-transitory machine-readable storage medium, where the term "non-transitory" does not encompass transitory propagating signals.

The pattern generator 120, the data compressor 122, and the record retriever 124 may each be implemented as instructions that program the processor 112. Alternatively, or additionally, the pattern generator 120, the data compressor 122, and the record retriever 124 may each be implemented in hardware.

The pattern generator 120 may generate patterns 103 based on a set of strings in the full dataset 101. In some examples, the set of strings may include some or all of the strings in the full dataset 101. For example, the pattern generator 120 may sample only some of the strings in the full dataset 101 to generate and select one or more patterns 103. Alternatively, the pattern generator 120 may use all of the strings in the full dataset 101 to generate and select one or more patterns 103. Examples of operations that may be performed by the pattern generator 120 will be described in more detail with reference to FIGS. 2-8.

The data compressor 122 may generate a reduced dataset 107 by compressing a full dataset 101 using the patterns 103. The reduced dataset 107 will have at least some of the strings in the full dataset 101 that have been compressed. Thus, the reduced dataset 107 will have storage requirements that are less than the full dataset 101. Alternatively, or additionally, the data compressor 122 may compress new data records having strings using the patterns 103 and store the compressed new data records instead of the uncompressed strings. Examples of operations that may be performed by the data compressor 122 will be described in more detail with reference to FIG. 9. The record retriever 124 may restore compressed strings by applying a pattern 103 to generate the original string for data retrieval. Examples of operations that may be performed by the record retriever 124 will be described in more detail with reference to FIG. 10. It should be noted, however, that the methods illustrated in FIGS. 2-10 may be performed by any of the foregoing aspects of the computer system 110, whether these aspects are implemented as instructions or hardware.

Figure 2:
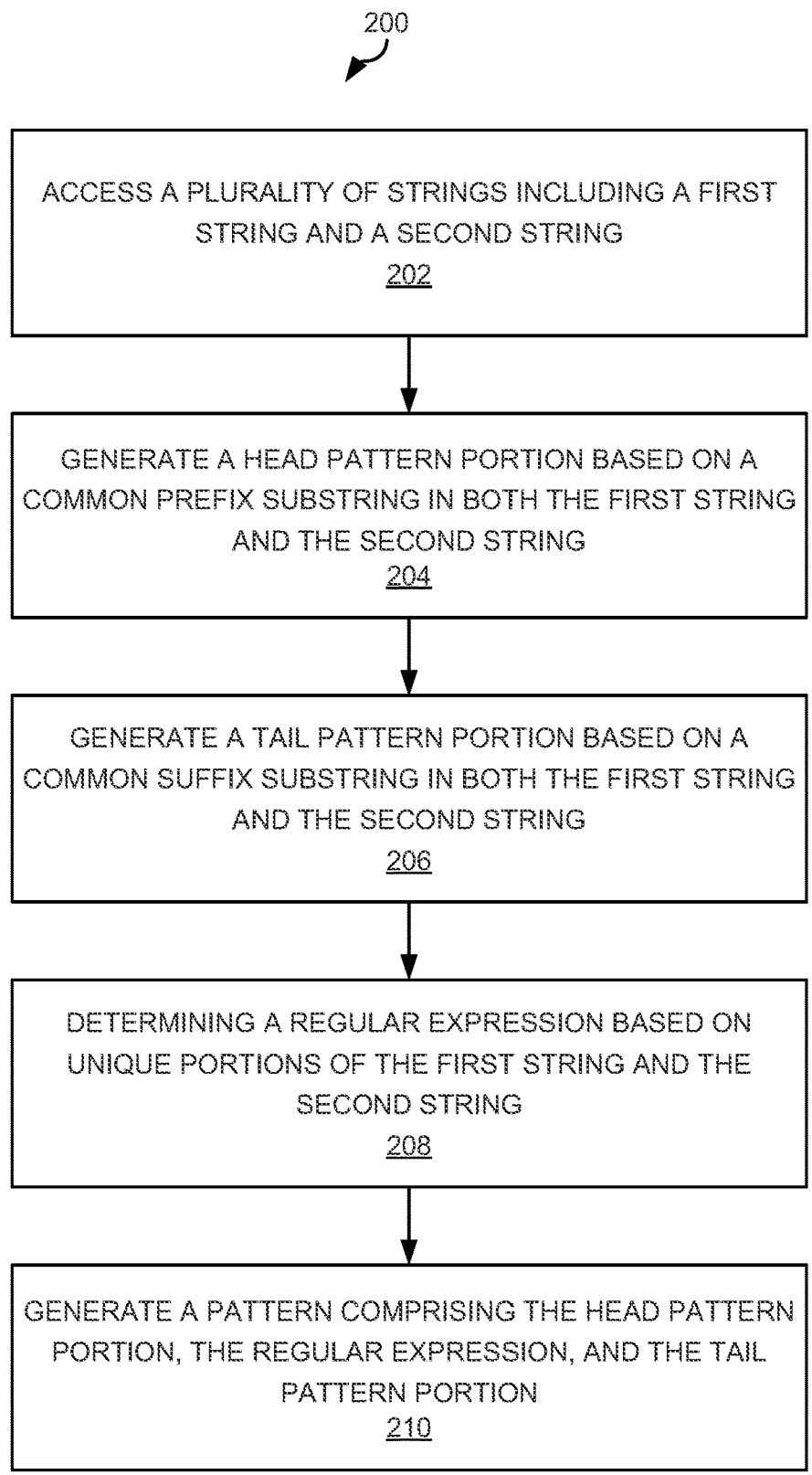
FIG. 2 illustrates an example of a method to generate patterns in strings to compress data.

FIG. 2 illustrates an example of a method 200 to generate patterns in strings to compress data. FIG. 2 will be discussed with reference to FIG. 3, which illustrates an example of strings and a pattern generated from the strings. At 202, the method 200 may include accessing a plurality of strings comprising a first string 302 and a second string 304. For example, referring to FIG. 3, a first string 302 and a second string 304 may be accessed to generate a pattern for data compression. Although the first string 302 and second string 304 are illustrated with alphanumeric characters, other types of characters may be used as well or instead of the illustrated characters.

Figure 3:
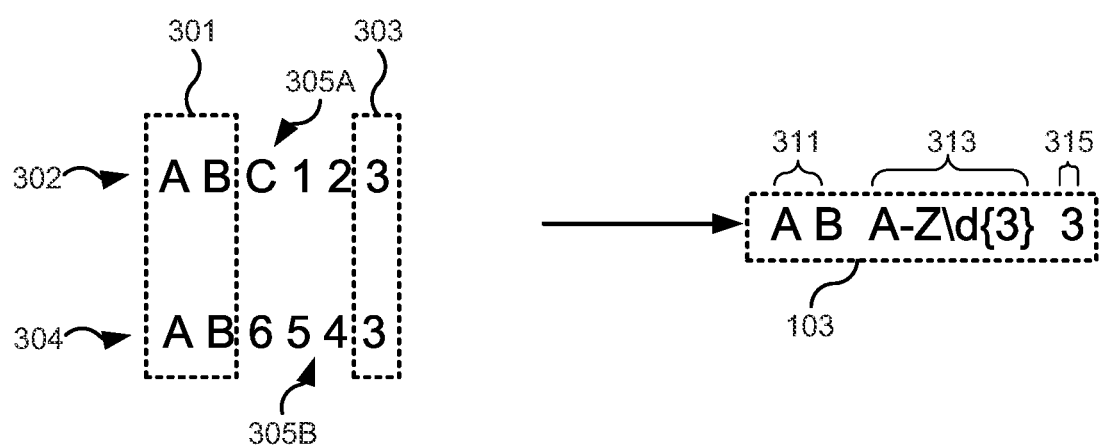
FIG. 3 illustrates an example of strings and a pattern generated from the strings.

At 204, the method 200 may include generating a head pattern portion 311 based on a common prefix portion 301 in both the first string 302 and the second string 304. A head pattern portion 311 may refer to a beginning portion of a pattern 103. "Beginning" in the context of strings and patterns (or portions thereof) is meant to convey location on the string from the beginning of the string or pattern or pattern if read left-to-right from the perspective of a human reader. A "common prefix portion" may refer to a portion (at least one character) of two or more strings that match from the beginning of each of the two or more strings. For example, FIG. 3 illustrates a common prefix portion 301

("AB") that matches both the beginning of string 302 ("ABC123") and the beginning of string 304 ("AB6543").

At 206, the method 200 may include generating a tail pattern portion 315 based on a common suffix portion 303 in both the first string 302 and the second string 304. A tail pattern portion 315 may refer to an ending portion of the pattern 103. "Ending" in the context of strings and patterns (or portions thereof) is meant to convey location on the string or pattern from the end of the string or pattern if read left-to-right from the perspective of a human reader. A "common suffix portion" may refer to a portion of two or more strings that match from the ending of each of the two or more strings. For example, FIG. 3 illustrates a common suffix portion 303 ("3") that matches both the ending of string 302 ("ABC123") and the ending of string 304 ("AB6543").

At 208, the method 200 may include determining an expression portion 313 based on unique portions 305A,B of the first string 302 and the second string 304. In some examples, the expression portion 313 may be configured as a regular expression. A "regular expression" may refer to an expression that defines a search pattern as generally understood in computer technology. In the illustrated example, based on the unique portions 305A and 305B, the expression portion 313 is encoded as a regular expression "A-Z\d{3}" that covers any combination of 3 capitalized letters and/or numbers. "Unique portions" may refer to, as between two strings that share a pattern, a portion of one string that does not match the other string and that is not part of the pattern. For example, "C12" is a unique portion 305A of string 302 that does not match string 304 in a pattern 103. Likewise, "654" is a unique portion 305B of string 304 that does not match string 302. It should be noted that the unique portion 305A and the unique portion 305B need not be the same size. Furthermore, a "unique portion" does not denote globally unique. In other words, a unique portion is intended to refer to uniqueness with respect to a particular pattern and/or two or more strings. It should be further noted that any duplicate strings will include the same "unique portion." It should be further noted that some characters in the unique portion 305A may match the unique portion 305B, but unique portion 305A will have at least one character that does not match with unique portion 305B.

At 210, the method 200 may include generating a pattern 103 comprising the head pattern portion 311, the expression portion 313, and/or the tail pattern portion 315. The pattern 103 may be used to compress data records. For example, a string to be stored that matches the pattern 103 is stored in association with a linkage to the pattern 103 without storage of a substring portion of the string that matches the head pattern portion and without storage of a substring portion of the string that matches the tail pattern portion. In a particular example, a string ("AB+!@De3") may be stored as "+!@De" and a link to the pattern 103. The pattern 103 may then be used to retrieve the original version of the string, in which "+!@De" may replace the regular expression in the pattern 103. It should be noted that the method 200 may be implemented to generate the pattern 103 with any combination of one or more of the head pattern portion 311, the expression portion 313, and the tail pattern portion 315. For example, if there is no common prefix portion 301, then the head pattern portion 311 may be omitted from the pattern 103. Likewise, if there is no common suffix portion 303, then the tail pattern portion 315 may be omitted from the pattern 103.

In some examples, to increase throughput and performance of generating patterns from strings, the method 200 may be implemented through hierarchical data structures to identify head pattern portions (such as the head pattern portion 311), tail pattern portions (such as the tail pattern portion 315), and unique portions (such as unique portions 305A,B).

Figure 4:
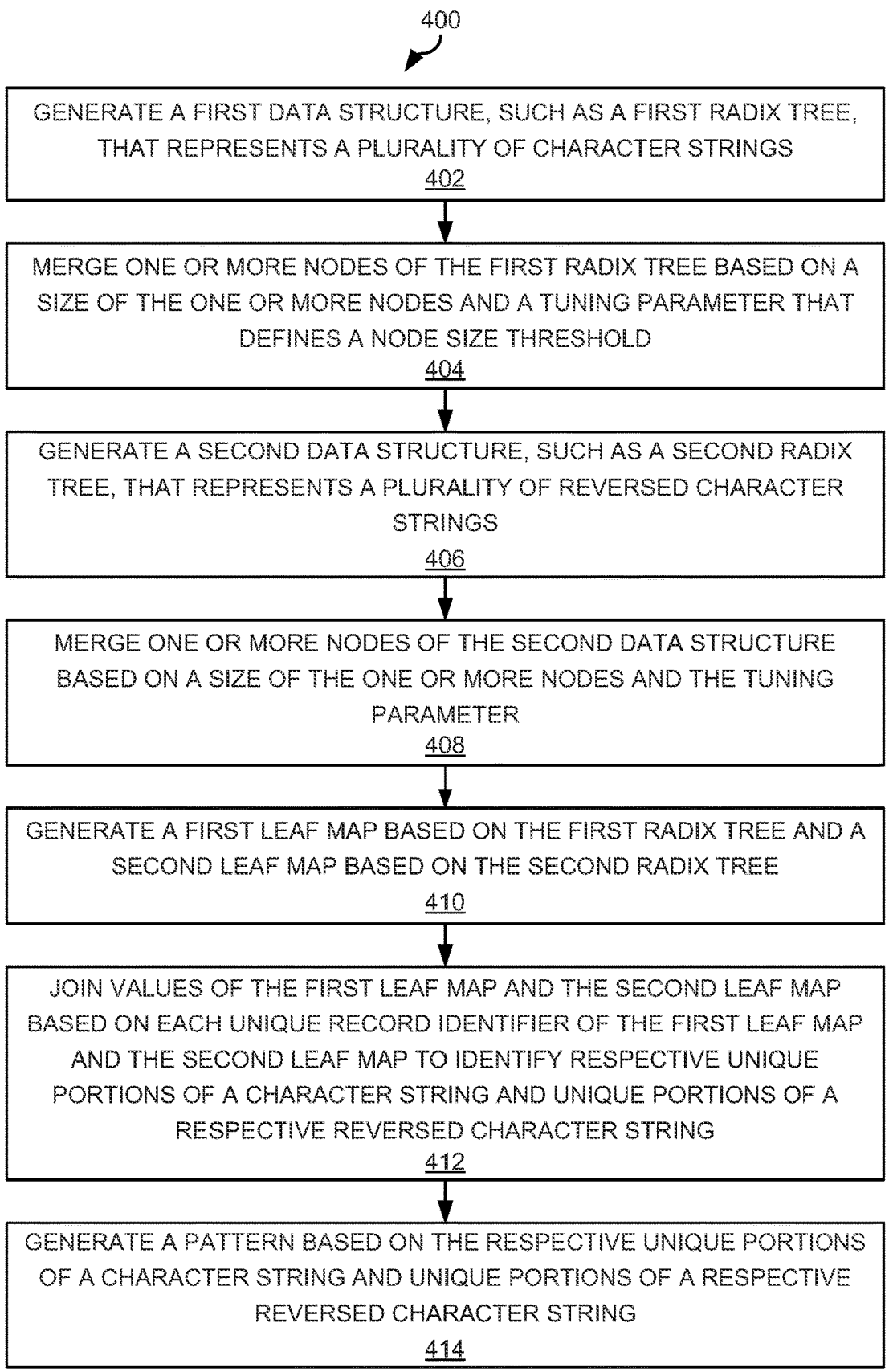
FIG. 4 illustrates an example of a method to generate patterns in strings to compress data based on hierarchical data structures.

For example, FIG. 4 illustrates an example of a method 400 of generating patterns from strings to compress data based on hierarchical data structures. FIG. 4 will be discussed with reference to FIGS. 5-8.

At 402, the method 400 may include generating a first data structure, such as a first radix tree, that represents a plurality of strings. The strings may be part of respective data records to be compressed. For example, referring to FIG. 5, six strings (shown in the "String" column) are illustrated. Each string may be associated with a unique record identifier, illustrated as RID 1-6. Each node in the first radix tree may include a portion of a respective string. The first radix tree may include a plurality of first leaf nodes. Each first leaf node may be associated with a unique portion of a respective string and a unique record identifier that uniquely identifies the respective string.

FIG. 6 illustrates an example of the first radix tree 600, which represents strings associated with RID 1-6. Referring to FIG. 6, each node is illustrated as a circle. Nodes may include a root node ("ROOT"), parent nodes and leaf nodes. Each leaf node is labeled with a corresponding RID 1-6. Except for the root node, each node may be keyed to a respective portion of a string. In other words, each key of each node may be a portion of a respective string. The value of each key of each parent node may be a set of one or more child nodes in the branch. The child nodes may themselves be parent nodes or leaf nodes. The value of each key of each leaf node is the corresponding RID 1-6.

Generating the first radix tree may include identifying common portions across strings in which such common portions are placed on higher nodes (closer to the ROOT node). Strings may be processed to find matching string portions starting from the beginning of strings. At least one character match among two or more strings may be required to create a parent node. A fork may occur when the match stops or no match is found. For example, four of the strings start with "A" and therefore will be part of the branch starting with a node keyed by "A" while two of the strings start with "B" and therefore will be forked to form part of the branch starting with a node keyed by "B." Thus, the branch starting with the node keyed by "A" will ultimately have four leaf nodes and the branch starting with the node keyed by "B" will ultimately have two leaf nodes. This process of finding common portions and forking is repeated to form lower portions of the tree until a leaf node is reached. For example, after the node keyed by "A," a fork occurs because the next letter after strings starting with "A" is "C" (RID 4) and "B" (RIDs 1-3).

Traversing the first radix tree 600 from the root node ("ROOT") down to the leaf nodes reproduces a corresponding string. For example, for RID 1, the associated string is "ABC123." The first radix tree 600 represents this string as respective keys "A," "B", "C" and "123." Keys "A" through "C" are associated with respective parent nodes and "123" is associated with a leaf node, which indicates the end of the string. Thus, to recreate the RID 1 string, the first radix tree 600 may be traversed from the root node down to the leaf node corresponding to RID 1. Other strings for other RIDs 2-6 may be similarly represented and recreated.

In the first radix tree 600, portions of strings that are common at the beginning of two or more strings may be represented as a parent node while unique portions of strings may be represented as leaf nodes. Put another way, parent nodes of the first radix tree 600 may encode (and therefore be used to identify) common prefix portions 301 (referring to FIG. 3) among strings and leaf nodes may encode (and therefore be used to identify) unique portions 305 of strings.

Figure 8:
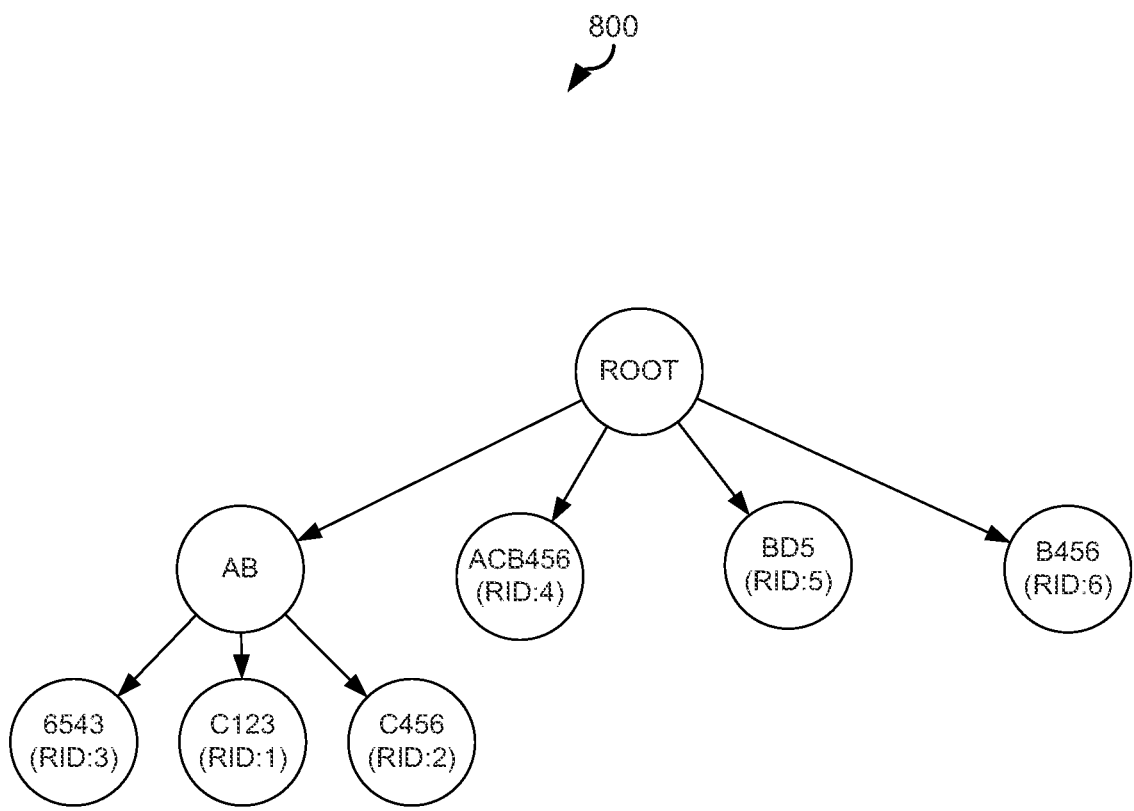
FIG. 8 illustrates an example of a merged version of the first data structure illustrated in FIG. 6.

In some examples, the first radix tree 600 may be pruned to reduce its overall size. For example, referring back to FIG. 4, at 404, the method 400 may include merging one or more parent nodes of the first radix tree based on a size of the one or more parent nodes and a tuning parameter that defines a node size threshold. A parent node having a node size less than or equal to the tuning parameter may be merged into a child node. A node size may refer to a number of child nodes that a parent node has. FIG. 8 is an example of a merged version of the first radix tree 600 that has been merged with a tuning parameter of 2. Other tuning parameters may be used as well depending on particular needs. The tuning parameter may be adjusted to vary the size of the first radix tree 600. In some examples, the tuning parameter may be set to zero or null to indicate no merging is to occur. Referring to FIGS. 6 and 8, the parent node keyed by "B" in FIG. 6 has two child nodes and therefore will be merged into these child nodes to form nodes keyed by "BD5" and "B456" in FIG. 8. Similarly, the parent node keyed by "C" in FIG. 6 has two child nodes and therefore will be merged into these child nodes to form nodes keyed by "C123" and "C456" in FIG. 8. After this merge, the parent node keyed by "B" will have three child nodes keyed by "6543", "C123", and "C456." Thus, the parent node keyed by "B" will not be merged into a child node. Proceeding up the radix tree to the node keyed by "A", this node now has two child nodes keyed by "CB456" and "B." Thus, the node keyed by "A" will be merged into its child nodes to form the final result illustrated in FIG. 8.

At 406, the method 400 may include generating a second data structure, such as a second radix tree, that represents a plurality of reversed strings. The second radix tree may be generated in the same manner as the first radix tree except that reversed strings are used instead of the strings. Each reversed string of the plurality of reversed strings is a reverse of a corresponding string of the plurality of strings and each reversed string being associated with the unique record identifier of the corresponding string. Similar to the first radix tree, the second radix tree includes a plurality of second leaf nodes. Each second leaf node is associated with a unique portion of a respective reversed string and the unique record identifier associated with the respective reversed string. Thus, for a given RID 1-6, its string is represented in the first radix tree and a reverse of its string is represented in the second radix tree.

FIG. 7 illustrates an example of the second radix tree 700, which represents the reversed strings in the "Reverse String" column at FIG. 5. In the second radix tree 700, because of the representation of reversed strings, portions of (corresponding non-reversed) strings that are common at the ends of two or more strings may be represented as a parent node while unique portions of strings may be represented as leaf nodes. Put another way, parent nodes of the second radix tree 700 may encode (and therefore be used to identify) common suffix portions 303 (referring to FIG. 3) among strings and leaf nodes may encode (and therefore be used to identify) unique portions 305 of strings. It should be noted that the second radix tree 700 may be merged in a manner similar to the first radix tree 600.

For example, at 408, the method 400 may include merging one or more parent nodes of the second radix tree 700 based on a size of the one or more parent nodes and the tuning parameter that defines the node size threshold. Such merging may be similar to the merging at 404.

Because the keys of leaf nodes of the first radix tree 600 (or merged first radix tree 800, depending on whether merger is performed) and the second radix tree 700 (or merged second radix tree, depending on whether merger is performed) are unique string portions that points to respective values of RIDs, a mapping to obtain RID to unique string portions may be generated.

For example, at 410, the method 400 may include generating a first leaf map based on the first radix tree and a second leaf map based on the second radix tree. To illustrate, the merged first radix tree 800 will be used as an example of generating a first leaf map based on the first radix tree. However, the first radix tree 600 may be used instead of the merged first radix tree 800 if no merging is performed on the first radix tree 600. Thus, "generating a first leaf map based on the first radix tree" may include generating a first leaf map using the first radix tree 600 or the merged first radix tree 800. As previously noted, each leaf node may be keyed by a unique portion of a respective string. Each value of the key may be the corresponding RID that uniquely identifies the respective string from which the unique portion was derived. A simplification of the mapping appears below with reference to FIG. 8 for illustrative convenience.

The following illustrates the key=value pair of each leaf node in the merged first radix tree 800, in which the keys (unique string portions) are bracketed and point to respective RID values. It should be noted that any structure may represent the key=value pairing as would be appreciated by those skill in the art.

first_leaf_node{"C123"}=RID: 1
first_leaf_node{"C456"}=RID: 2
first_leaf_node{"6543"}=RID: 3
first_leaf_node{"ACB456"}=RID: 4
first_leaf_node{"BD5"}=RID: 5
first_leaf_node{"B456"}=RID: 6

The keys and values may be remapped so that the RID 1-6 are keys that point to respective unique string portion values.

first_leaf_map{RID: 1}="C123"
first_leaf_map{RID: 2}="C456"
first_leaf_map{RID: 3}="6543"
first_leaf_map{RID: 4}="ACB456"
first_leaf_map{RID: 5}="BD5"
first_leaf_map{RID: 6}="B456"

Likewise, the following illustrates the key=value pair of each leaf node in the second radix tree 700, in which the keys (unique string portions) are bracketed and point to respective RID values.

second_leaf_node{"21CBA"}=RID: 1
second_leaf_node{"CBA"}=RID: 2
second_leaf_node{"456BA"}=RID: 3
second_leaf_node{"BCA"}=RID: 4
second_leaf_node{"5DB"}=RID: 5
second_leaf_node{"B"}=RID: 6

The keys and values may be remapped so that the RID 1-6 are keys that point to respective unique string portion values.

second_leaf_map{RID: 1}="21CBA"
second_leaf_map{RID: 2}="CBA"
second_leaf_map{RID: 3}="456BA"
second_leaf_map{RID: 4}="BCA"
second_leaf_map{RID: 5}="5DB"
second_leaf_map{RID: 6}="B"

The first leaf map may key each unique record identifier of a respective first leaf node to the unique portion of the respective string and the second leaf map may key each unique record identifier of a respective second leaf node to the unique portion of the respective reversed string. In this manner, for a given RID, the first leaf map may be used to obtain unique string portions derived from the first radix tree 600 (or 800) and the second leaf map may be used to obtain unique string portions derived from the second radix tree 700 (or its merged version if the second radix tree 700 is merged).

At 412, the method 400 may include joining values of the first leaf map and the second leaf map based on each unique record identifier of the first leaf map and the second leaf map to identify respective unique portions of a string and unique portions of a respective reversed string. For example, since both the first leaf map and the second leaf map are keyed by RIDs 1-6, the RIDs may be used to join their values. Such joining may include, for example, for each key of the first leaf map, accessing its value and then performing a key lookup on the second leaf map (or vice versa). Other ways of joining based on common keys may be used as would be appreciated by those having skill in the art.

TABLE 1

Table 1 is an example of results of joining values of the first leaf map and the second leaf map for illustrative purposes, along with the original string and reverse string for reference.

| (a) RID | (b) first_leaf_map_values | (c) second_leaf_map_values | (d) String | (e) Reverse String |
|---|---|---|---|---|
| 1 | C123 | 21CBA | ABC123 | 321CBA |
| 2 | C456 | CBA | ABC456 | 654CBA |
| 3 | 6543 | 456BA | AB6543 | 3456BA |
| 4 | ACB456 | BCA | ACB456 | 654BCA |
| 5 | BD5 | 5DB | BD5 | 5DB |
| 6 | B456 | B | B456 | 654B |

The joined values illustrated at columns (b) and (c) of Table 1 represent unique portions of respective strings and reversed strings illustrated at columns (d) and (e) of Table 1. At 414, the method 400 may include generating a pattern based on the respective unique portions of a string (such as column (b) of Table 1) and unique portions of a respective reversed string (such as column (c) of Table 1).

Generating the pattern may include determining a common prefix portion (such as 301 illustrated in FIG. 3), a unique portion (such as 305A,B), and a common suffix portion (such as 303). The unique portions of a string in the first_leaf_map (which are based on the merged first radix tree 800) may be used to determine the common prefix portion. Likewise, because the second_leaf_map is generated based on a reverse of the strings, the unique portions of a string in the second_leaf_map may be used to determine the common suffix portion.

The method 400 may include, for each value (unique portion of a string) of the first leaf map, identifying portions that are missing in the unique portion of the string compared to the (original) string via a string comparison. Similarly, for each value (unique portion of a string) of the second leaf map, the method 400 may include identifying portions that are missing in the unique portion of the string compared to the reversed string. For example, to do so on the reverse strings, the pattern generator 120 may reverse each unique portion so that the unique portion becomes reversed for comparison to the original string. In this way, the common suffixes of strings may be determined.

TABLE 2

Table 2 is an example of a result of identifying missing portions to identify head pattern portions and tail pattern portions. The common prefix portion illustrated at Table 2, column b, is shown in parentheses and may be used to generate a head pattern portion. The common suffix portion illustrated at Table 2, column c, is shown in parentheses and may be used to generate a tail pattern portion.

| (a) RID | (b) first_leaf_map values showing common prefix portions enclosed by parenthesis | (c) Reversed second_leaf_map values showing common suffix portions enclosed by parenthesis | (d) String | (e) Pattern |
|---|---|---|---|---|
| 1 | (AB)C123 | ABC12(3) | ABC123 | AB*3 |
| 2 | (AB)C456 | ABC(456) | ABC456 | AB*456 |
| 3 | (AB)6543 | AB654(3) | AB6543 | AB*3 |
| 4 | (null)ACB456 | ACB(456) | ACB456 | none*456 |
| 5 | (null)BD5 | BD5(null) | BD5 | none*none |
| 6 | (null)B456 | B(456) | B456 | none*456 |

In Table 2, the results of pattern generation include four patterns: AB*3, AB*456, *456, and a null (no pattern), where "*" is an expression portion that represents any character, which corresponds to the unique portions of the strings. In various examples, some or all of the generated patterns may be retained for data compression. For example, maximum compression may be achieved by retaining and using all generated patterns. However, storing and using more patterns may result in computational overhead including storage and processor time to compute each record against each pattern. Thus, as a further improvement, in some examples, only some of the generated patterns may be retained. In these examples, one or more of the generated patterns may be selected for retention, storage, and/or use based on a number of records that match the pattern and a match threshold. The match threshold may specify a number of matches to retain, store, and/or use a given pattern. For example, a match threshold of two may specify that a pattern must match two or more strings to be retained, stored, and/or used. In this example, a match threshold of two may result in the selection of the "AB*3" and "*456" patterns since each of these patterns have two or more matching strings.

In some examples, the method 400 may include storing the pattern. For example, the pattern generator 120 may assign each selected pattern with a pattern identifier. If a string matches the pattern, then the pattern generator 120 may store only unique portions of the string and an association with the pattern identifier for the matching pattern. In some examples, the pattern may be stored as illustrated in Table 2 (such as the patterns: "AB*3" and "AB*456."). In other examples, the method 400 may include storing each pattern as a more detailed regular expression. The method 400 may include generating a regular expression based on unique portions covered by the pattern.

To generate the regular expression, the method 400 may include replacing the wildcard "*" with more specific regular expression portions by determining whether unique portions are alphabetic, numeric, alphanumeric, and/or contain special characters and converting the characters into corresponding regular expressions based on what is observed.

TABLE 3

Table 3 illustrates an example of regular expressions generated for each wildcard in the patterns++. The syntax used for the regular expressions will be appreciated by those skilled in computer languages.

| (a) RID | (b) String | (c) Pattern | (d) Unique Portion | (e) Regular Expression for Unique Portion | (f) Pattern as regular expression |
|---|---|---|---|---|---|
| 1 | ABC123 | AB*3 (Pattern ID 1) | C12 | 3 alphanumeric characters [A-Z0-9]{3} | AB[A-Z0-9]{3}3 |
| 2 | ABC456 | *456 (Pattern ID 2) | ABC | 3 alphabetic characters [A-Z]{3} | [A-Z]{3}456 |
| 3 | AB6543 | AB*3 (Pattern ID 1) | 654 | 3 numeric characters [0-9]{3} | AB[0-9]{3}3 |
| 4 | ACB456 | *456 (Pattern ID 1) | ACB | 3 alphabetic characters [A-Z]{3} | [A-Z]{3}456 |
| 5 | BD5 | Null (No pattern) | BD5 | None | None |
| 6 | B456 | *456 (Pattern ID 2) | B | 1 Alphabetic character [A-Z]{1} | [A-Z]{1}B |

The patterns with regular expressions illustrated in column (e) of Table 3 may be rolled up to consolidate the patterns. For example, patterns that have the same heads and tails but their regular expression is alphabetic, numeric, or alphanumeric are converted to alphanumeric. Patterns that have the same heads and tails but for the number of characters should be updated to ranges instead of exact amounts. For example, RIDs 2, 4, and 6 have the same head pattern portions "[A-Z]" and tail pattern portions "456" but a differing number of alphabetic characters in the middle: 1 or 3. These patterns may be rolled into a single pattern that indicates that the unique string portion may be between 1 and 3 characters. RIDs 1 and 3 have the same head pattern portion "AB" and tail pattern portion "3" but RID 1 has an alphanumeric unique string portion and RID 3 has a numeric unique string portion. In these scenarios, non-alphanumeric portions may be associated with an alphanumeric expression. The result may be that the same number of patterns is generated, but with regular expressions.

TABLE 4

Table 4 illustrates rolled up versions of the patterns as regular expressions.

| (a) RID | (b) String | (c) Pattern as regular expression |
|---|---|---|
| 1 | ABC123 | AB[A-Z0-9]{3}3 |
| 2 | ABC456 | [A-Z]{1,3}456 |
| 3 | AB6543 | AB[A-Z0-9]{3}3 |
| 4 | ACB456 | [A-Z]{1,3}456 |
| 5 | BD5 | None |
| 6 | B456 | [A-Z]{1,3}456 |

TABLE 5A

Table 5A illustrates the patterns without rolled up regular expressions.

| Pattern ID | Pattern |
|---|---|
| 1 | AB*3 |
| 2 | *456 |

TABLE 5B

Table 5B illustrates the patterns with rolled up regular expressions.

| Pattern ID | Pattern |
|---|---|
| 1 | AB[A-Z0-9]{3}3 |
| 2 | [A-Z]{1,3}456 |

Tables 5A and/or 5B may represent pattern storage, in which each pattern is identified by a unique pattern ID.

TABLE 6

Table 6 illustrates how the strings illustrated in FIG. 5 may be stored using the patterns of either Table 5A or 5B, depending on whether the patterns are stored with broad wildcards as in Table 5A or more specifically as in Table 5B. Each RID 1-6 may be stored in associated with a respective unique portion and Pattern ID. As illustrated, the full string portions may be omitted for RIDs that match a pattern, resulting in storage reduction. When no match to a selected pattern exists (illustrated as Pattern ID null), then the unique portion represents the entire string.

| RID | Unique Portion | Pattern ID |
|---|---|---|
| 1 | "C12" | 1 |
| 2 | "ABC" | 2 |
| 3 | "654" | 1 |
| 4 | "ACB" | 2 |
| 5 | "BD5" | Null |
| 6 | "B" | 2 |

To recreate the string from such reduced storage entry, the Pattern TD may be retrieved and the unique portion may be substituted in for the regular expression. For example, for RID 1, the pattern "AB*3" or "AB[A-Z0-9]{3}3" may be retrieved depending on whether a broad or more specific regular expression is stored. The unique portion "C12" may be substituted in for the "*" or the "AB[A-Z0-9]{3}3", resulting in the original string "ABC123" for RID 1. Other records may be similarly retrieved.

When storing new records, such as when a new record is added to a record database, the string may be matched against existing patterns. If a match is found, then the record may be stored in the same way as illustrated in Table 6—only with the unique portions that match the regular expression and a stored association with the matching pattern. In some examples, if no match is found for the new record, a new pattern may be generated and potentially selected as a pattern as disclosed herein to compress existing and/or new records.

It should be noted that not all strings are alphanumeric. Strings may contain special characters such as hyphens. In these examples, the special character may be included in the regular expression and the regular expression may be split on the special character. For example, the string ZYX-53 would result in the regular expression [A-Z]{3}-[0-9]{2}.

By storing only unique portions of the string, storage requirements may be reduced. For example, referring to Table 6, a reduction of fifteen characters, or 13 percent, is achieved (not counting storage of the pattern itself) by storing the strings for RIDs 1-4 and 6 based on their matches to generated and selected patterns identified by Pattern IDs 1 and 2. Such storage reduction may be significant for large datasets. It should be noted that the percentage of reduction will vary (be more or less than in the example of Table 6) depending on the data being compressed.

Figure 9:
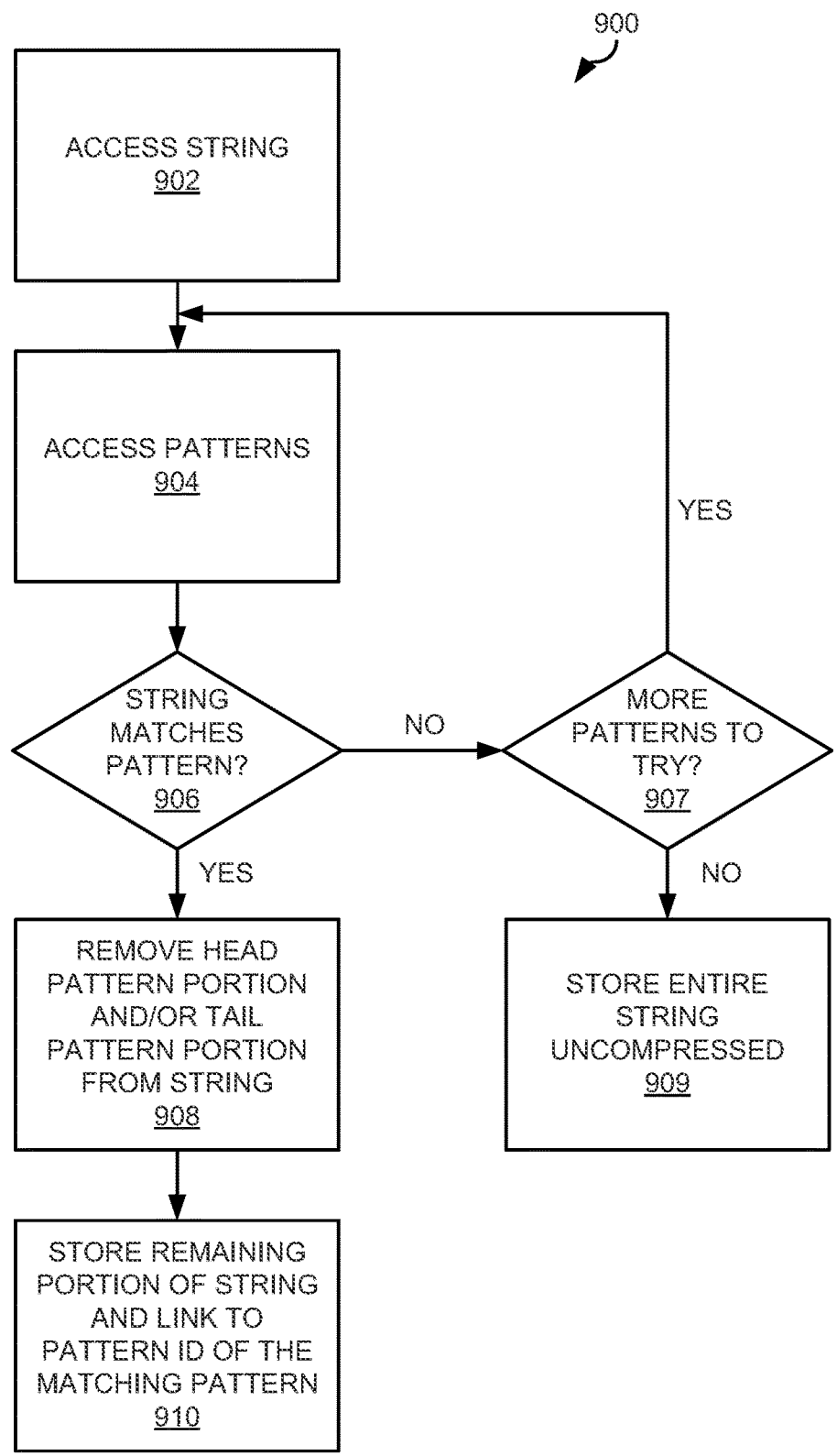
FIG. 9 illustrates an example of a method to use the generated patterns in strings to compress data.

FIG. 9 illustrates an example of a method 900 to use the generated patterns in strings to compress data. It should be noted that the method 900 may be performed on some or all of the data records in the full dataset 101 and/or may be performed on new data records that have strings.

At 902, the method 900 may include accessing a string. The string may be a candidate for compression, such as for an existing data record or a new data record. At 904, the method 900 may include accessing patterns, such as patterns 103. At 906, the method 900 may include determining whether the string matches a pattern 103 from among the patterns 103. For example, the method 900 may include evaluating the string against the pattern 103. Such evaluation may be performed using regular expression evaluation. For example, the method 900 may include determining whether the head pattern portion of the pattern 103 matches a beginning portion of the string, whether the expression portion of the pattern 103 matches the unique portion of the string, and/or whether the tail pattern portion of the pattern 103 matches the end of the string.

If a match is found, at 908, the method 900 may include removing the head pattern portion and/or tail pattern portion from the string. Doing so may retain the unique portion of the string. At 910, the method 900 may include storing the retained portion of the string with a link to a pattern identifier that identifies the matching pattern 103. Such retained portion may be considered a compressed since the number of characters of the retained portion is less than the number of characters from the original (uncompressed) string.

Returning to 906, if the string does not match a current pattern, at 907, the method 900 may include determining whether there exist more patterns to try. If so, the method 900 may return to 904 to access the next pattern to be evaluated. If not, at 909, the method 900 may store the string uncompressed since no matching pattern has been found.

Figure 10:
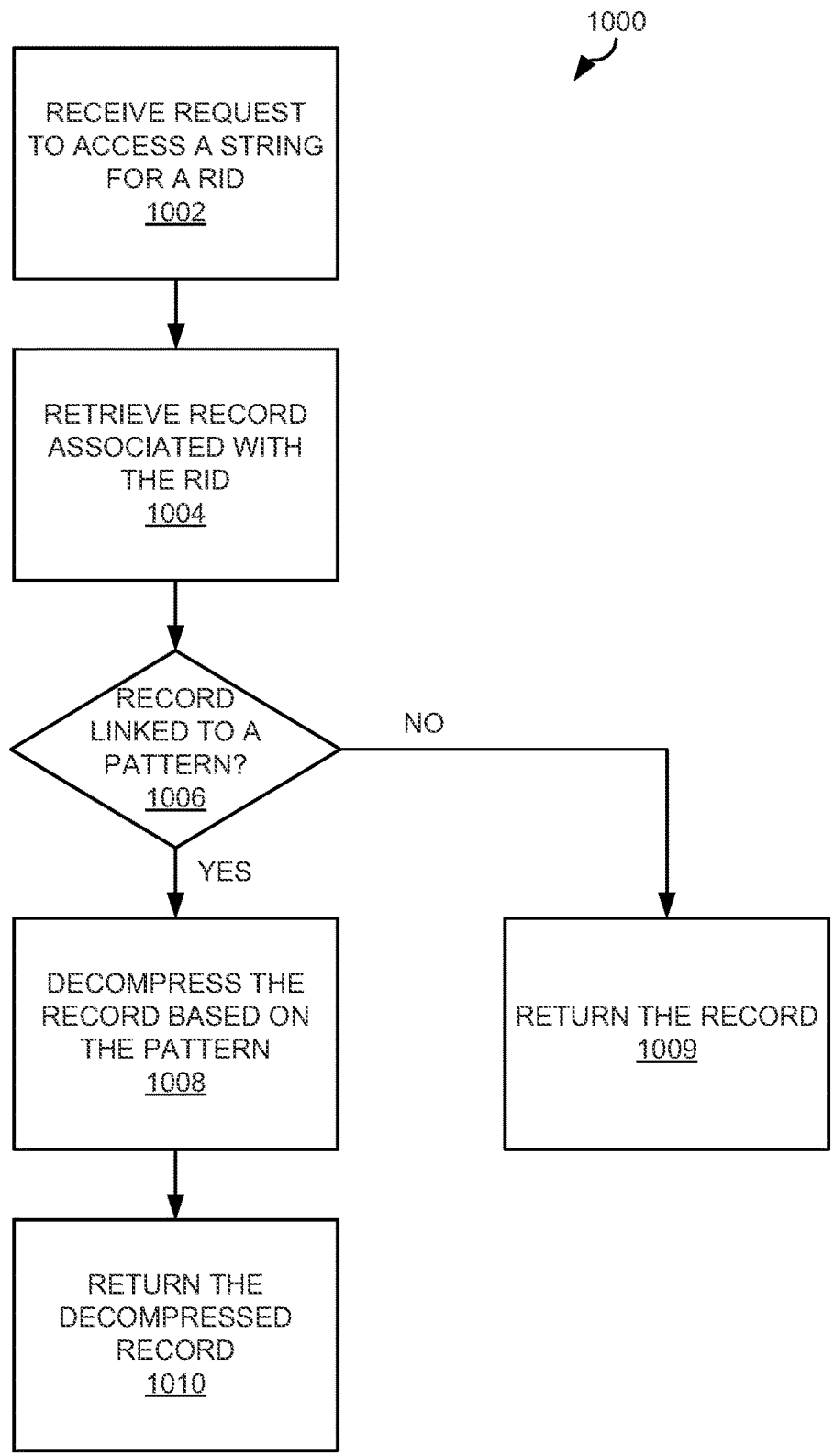
FIG. 10 illustrates an example of a method to retrieve decompressed data.

FIG. 10 illustrates an example of a method 1000 to retrieve decompressed data.

At 1002, the method 1000 may include receiving a request to access a string associated with a RID (such as RIDs 1-6). At 1004, the method 1000 may include retrieving a record associated with the RID. The record may include a compressed string if the requested record was compressed or an uncompressed string if not compressed. At 1006, the method 1000 may include determining whether the record is linked to a pattern. If yes, at 1008, the method 1000 may include decompressing the record based on the pattern with which the record is linked. Decompressing the record may include replacing an expression portion of the pattern with the retrieved record. At 1010, the method 1000 may include returning the decompressed record.

Returning to 1006, if the record is not linked to a pattern, at 1009, the method 1000 may include returning the record. Because the record is not linked to a pattern, the record is not compressed and may be returned without decompression.

Figure 11:
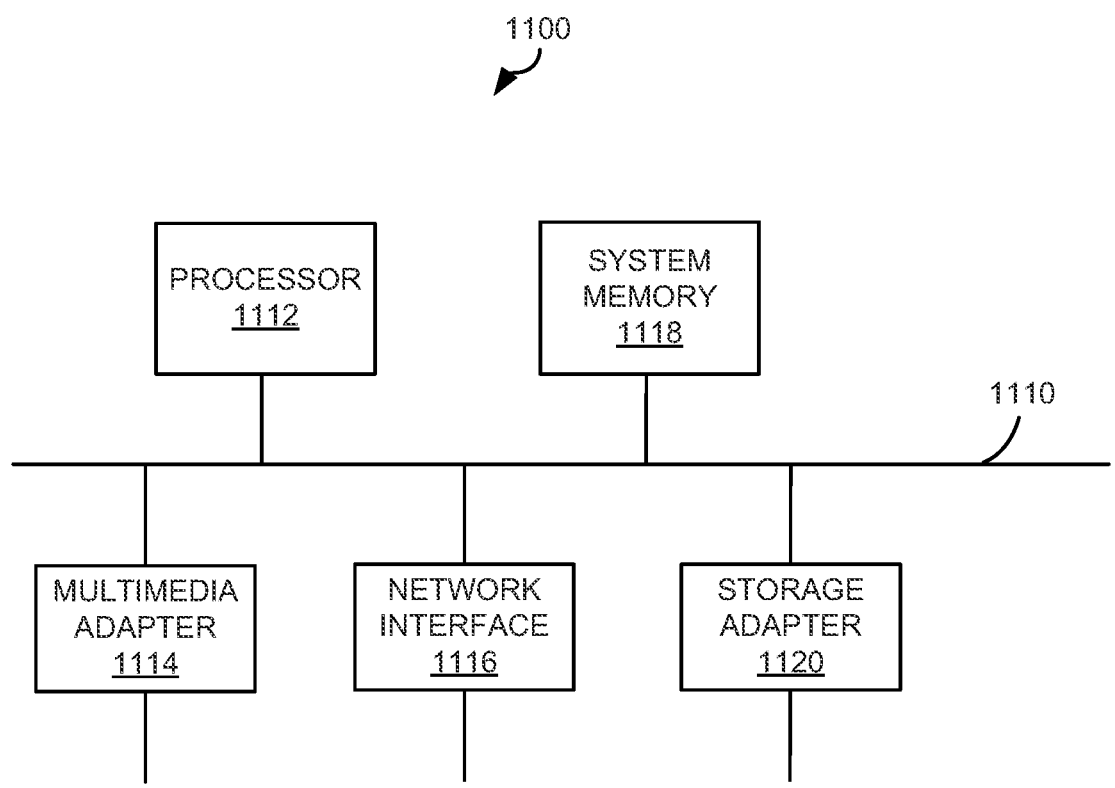
FIG. 11 illustrates an example of a computer system that may be implemented by devices illustrated in FIG. 1.

FIG. 11 illustrates an example of a computer system that may be implemented by devices illustrated in FIG. 1.

FIG. 11 illustrates an example of a computer system that may be implemented by devices illustrated in FIG. 1. Various ones of the devices of system environment 100 may be implemented based on some or all of the computer system 1100. The computer system 1100 may include, among other things, an interconnect 1110, a processor 1112, a multimedia adapter 1114, a network interface 1116, a system memory 1118, and a storage adapter 1120.

The interconnect 1110 may interconnect various subsystems, elements, and/or components of the computer system 1100. As shown, the interconnect 1110 may be an abstraction that may represent any one or more separate physical buses, point-to-point connections, or both, connected by appropriate bridges, adapters, or controllers. In some examples, the interconnect 1110 may include a system bus, a peripheral component interconnect (PCI) bus or PCI-Express bus, a HyperTransport or industry standard architecture (ISA)) bus, a small computer system interface (SCSI) bus, a universal serial bus (USB), IIC (I2C) bus, or an Institute of Electrical and Electronics Engineers (IEEE) standard 1384 bus, or "firewire," or other similar interconnection element.

In some examples, the interconnect 1110 may allow data communication between the processor 1112 and system memory 1118, which may include read-only memory (ROM) or flash memory (neither shown), and random-access memory (RAM) (not shown). It should be appreciated that the RAM may be the main memory into which an operating system and various application programs may be loaded. The ROM or flash memory may contain, among other code, the Basic Input-Output system (BIOS) which controls basic hardware operation such as the interaction with one or more peripheral components.

The processor 1112 may control operations of the computer system 1100. In some examples, the processor 1112 may do so by executing instructions such as software or firmware stored in system memory 1118 or other data via the storage adapter 1120. In some examples, the processor 1112 may be, or may include, one or more programmable general-purpose or special-purpose microprocessors, digital signal processors (DSPs), programmable controllers, application specific integrated circuits (ASICs), programmable logic device (PLDs), trust platform modules (TPMs), field-programmable gate arrays (FPGAs), other processing circuits, or a combination of these and other devices.

The multimedia adapter 1114 may connect to various multimedia elements or peripherals. These may include devices associated with visual (e.g., video card or display), audio (e.g., sound card or speakers), and/or various input/output interfaces (e.g., mouse, keyboard, touchscreen).

The network interface 1116 may provide the computer system 1100 with an ability to communicate with a variety of remote devices over a network such as the communication network 1011 illustrated in FIG. 1. The network interface 1116 may include, for example, an Ethernet adapter, a Fibre Channel adapter, and/or other wired- or wireless-enabled adapter. The network interface 1116 may provide a direct or indirect connection from one network element to another, and facilitate communication and between various network elements.

The storage adapter 1120 may connect to a standard computer readable medium for storage and/or retrieval of information, such as a fixed disk drive (internal or external).

Other devices, components, elements, or subsystems (not illustrated) may be connected in a similar manner to the interconnect 1110 or via a network such as the communication network 1011. The devices and subsystems can be interconnected in different ways from that shown in FIG. 11. Instructions to implement various examples and implementations described herein may be stored in computer-readable storage media such as one or more of system memory 1118 or other storage. Instructions to implement the present disclosure may also be received via one or more interfaces and stored in memory. The operating system provided on computer system 1100 may be MS-DOS®, MS-WINDOWS®, OS/2®, OS X®, IOS®, ANDROID®, UNIX®, Linux®, or another operating system.

Throughout the disclosure, the terms "a" and "an" may be intended to denote at least one of a particular element. As used herein, the term "includes" means includes but not limited to, the term "including" means including but not limited to. The term "based on" means based at least in part on. In the Figures, the use of the letter "N" to denote plurality in reference symbols is not intended to refer to a particular number.

The databases described herein may be, include, or interface to, for example, an Oracle™ relational database sold commercially by Oracle Corporation. Other databases, such as Informix™, DB2 or other data storage, including file-based, or query formats, platforms, or resources such as OLAP (On Line Analytical Processing), SQL (Structured Query Language), a SAN (storage area network), Microsoft Access™ or others may also be used, incorporated, or accessed. The database may comprise one or more such databases that reside in one or more physical devices and in one or more physical locations. The database may include cloud-based storage solutions. The database may store a plurality of types of data and/or files and associated data or file descriptions, administrative information, or any other data. The various databases may store predefined and/or customized data described herein.

The components of the system environment 100 illustrated in FIG. 1 may be connected to one another via a communication network 111, which may include the Internet, an intranet, a PAN (Personal Area Network), a LAN (Local Area Network), a WAN (Wide Area Network), a SAN (Storage Area Network), a MAN (Metropolitan Area Network), a wireless network, a cellular communications network, a Public Switched Telephone Network, and/or other network through which system environment 100 components may communicate.

The systems and processes are not limited to the specific embodiments described herein. In addition, components of each system and each process can be practiced independent and separate from other components and processes described herein. Each component and process also can be used in combination with other assembly packages and processes. The flow charts and descriptions thereof herein should not be understood to prescribe a fixed order of performing the method blocks described therein. Rather the method blocks may be performed in any order that is practicable including simultaneous performance of at least some method blocks. Furthermore, each of the methods may be performed by one or more of the system components illustrated in the figures.

Having described aspects of the disclosure in detail, it will be apparent that modifications and variations are possible without departing from the scope of aspects of the disclosure as defined in the appended claims. As various changes could be made in the above constructions, products, and methods without departing from the scope of aspects of the disclosure, it is intended that all matter contained in the above description and shown in the accompanying drawings shall be interpreted as illustrative and not in a limiting sense.

As will be appreciated based on the foregoing specification, the above-described embodiments of the disclosure may be implemented using computer programming or engineering techniques including computer software, firmware, hardware or any combination or subset thereof. Any such resulting program, having computer-readable code means, may be embodied or provided within one or more computer-readable media, thereby making a computer program product, i.e., an article of manufacture, according to the discussed embodiments of the disclosure. Example computer-readable media may be, but are not limited to, a flash memory drive, digital versatile disc (DVD), compact disc (CD), fixed (hard) drive, diskette, optical disk, magnetic tape, semiconductor memory such as read-only memory (ROM), and/or any transmitting/receiving medium such as the Internet or other communication network or link. By way of example and not limitation, computer-readable media comprise computer-readable storage media and communication media. Computer-readable storage media are tangible and non-transitory and store information such as computer-readable instructions, data structures, program modules, and other data. Communication media, in contrast, typically embody computer-readable instructions, data structures, program modules, or other data in a transitory modulated signal such as a carrier wave or other transport mechanism and include any information delivery media. Combinations of any of the above are also included in the scope of computer-readable media. The article of manufacture containing the computer code may be made and/or used by executing the code directly from one medium, by copying the code from one medium to another medium, or by transmitting the code over a network.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A system to compress data, comprising:
a processor programmed to:
 access a plurality of strings comprising a first string and a second string;
 generate a head pattern portion based on a common prefix portion in both the first string and the second string;
 generate a tail pattern portion based on a common suffix portion in both the first string and the second string;
 determine a regular expression based on unique portions of the first string and the second string; and
 generate a pattern comprising the head pattern portion, the regular expression, and the tail pattern portion, the pattern being used to compress the data, wherein a string to be stored that matches the pattern is stored in association with a linkage to the pattern without storage of a substring portion of the string that matches the head pattern portion and without storage of a substring portion of the string that matches the tail pattern portion.

2. The system of claim 1, wherein to generate the head pattern portion, the processor is programmed to:
 generate a first radix tree that represents the first string and the second string; and
 identify a common prefix portion of the first string and the second string based on a first leaf node associated with the first string and a second leaf node associated with the second string, wherein the head pattern portion is generated based on the common prefix portion.

3. The system of claim 2, wherein to generate the tail pattern portion, the processor is programmed to:
generate a second radix tree that represents a first reversed string and a second reversed string; and
identify a common suffix portion of the first string and the second string based on a third leaf node associated with the first reversed string and a fourth leaf node associated with the second reversed string, wherein the tail pattern portion is generated based on the common suffix portion.

4. The system of claim 1, wherein the processor is further programmed to:
access a candidate string to be compressed;
match the candidate string to the pattern; and
store only unique portions of the candidate string and an association of the candidate string with the pattern.

5. A system to compress data, comprising:
a processor programmed to:
generate a first data structure that represents a plurality of strings, the first data structure storing a common prefix portion of the plurality of strings and a unique portion of the plurality of string;
generate a second data structure that represents a plurality of reversed strings, each reversed string of the plurality of reversed strings being a reverse of a corresponding string of the plurality of strings and each reversed string being associated with a unique record identifier of the corresponding string, the second data structure comprising one or more parent nodes that include a respective common prefix portion of the plurality of strings and one or more leaf nodes associated with unique portions of the plurality of strings;
generate a first leaf map based on the first data structure and a second leaf map based on the second data structure, the first leaf map keying each unique record identifier of a respective first leaf node to the unique portion of the respective string and the second leaf map keying each unique record identifier of a respective second leaf node to the unique portion of the respective reversed string;
join values of the first leaf map and the second leaf map based on each unique record identifier of the first leaf map and the second leaf map to identify respective unique portions of a string and unique portions of a respective reversed string; and
generate a pattern based on the respective unique portions of a string and unique portions of a respective reversed string.

6. The system of claim 5, wherein the processor is programmed to:
merge, prior to generation of the first leaf map, one or more parent nodes of the first data structure based on a size of the one or more parent nodes and a merge parameter that defines a node size threshold to reduce a size of the first data structure.

7. The system of claim 5, wherein to generate the pattern, the processor is programmed to:
generate, based on the values in the first leaf map, which each represent a respective unique portion of a string of a respective leaf node of the first data structure, a head pattern portion of the pattern.

8. The system of claim 5, wherein to generate the pattern, the processor is programmed to:
generate, based on the values in the second leaf map, which each represent a respective unique portion of a reversed string of a respective leaf node of the second data structure, a tail pattern portion of the pattern.

9. The system of claim 5, wherein to generate the pattern, the processor is programmed to:
generate, for each of the respective unique portions, an expression portion of the pattern.

10. The system of claim 9, wherein the processor is further programmed to:
generate a regular expression for the expression portion of the pattern; and
store the pattern based on the regular expression.

11. The system of claim 10, wherein the processor is further programmed to:
roll up the regular expression to reduce a number of regular expressions used in patterns.

12. The system of claim 5, wherein to generate the first data structure, the processor is further programmed to:
generate a first radix tree based on the plurality of strings.

13. A method to compress data, comprising:
generating, by a processor, a first data structure that represents a plurality of strings, the first data structure storing a common prefix portion of the plurality of strings and a unique portion of the plurality of string;
generating, by the processor, a second data structure that represents a plurality of reversed strings, each reversed string of the plurality of reversed strings being a reverse of a corresponding string of the plurality of strings and each reversed string being associated with a unique record identifier of the corresponding string, the second data structure comprising one or more parent nodes that include a respective common prefix portion of the plurality of strings and one or more leaf nodes associated with unique portions of the plurality of strings;
generating, by the processor, a first leaf map based on the first data structure and a second leaf map based on the second data structure, the first leaf map keying each unique record identifier of a respective first leaf node to the unique portion of the respective string and the second leaf map keying each unique record identifier of a respective second leaf node to the unique portion of the respective reversed string;
joining, by the processor, values of the first leaf map and the second leaf map based on each unique record identifier of the first leaf map and the second leaf map to identify respective unique portions of a string and unique portions of a respective reversed string; and
generating, by the processor, a pattern based on the respective unique portions of a string and unique portions of a respective reversed string.

14. The method of claim 13, further comprising:
merging, by the processor, prior to generation of the first leaf map, one or more parent nodes of the first data structure based on a size of the one or more parent nodes and a merge parameter that defines a node size threshold to reduce a size of the first data structure.

15. The method of claim 13, wherein generating the pattern comprises:
generating, based on the values in the first leaf map, which each represent a respective unique portion of a string of a respective leaf node of the first data structure, a head pattern portion of the pattern.

16. The method of claim 13, wherein generating the pattern comprises:
generating, based on the values in the second leaf map, which each represent a respective unique portion of a reversed string of a respective leaf node of the second data structure, a tail pattern portion of the pattern.

17. The method of claim 13, wherein generating the pattern comprises:
   generating, for each of the respective unique portions, an expression portion of the pattern.

18. The method of claim 17, further comprising:
   generating, by the processor, a regular expression for the expression portion of the pattern; and
   storing, by the processor, the pattern based on the regular expression.

19. The method of claim 18, further comprising:
   rolling up, by the processor, the regular expression to reduce a number of regular expressions used in patterns.

20. The method of claim 13, wherein generating the first data structure comprises:
   generating a first radix tree based on the plurality of strings.

* * * * *